United States Patent [19]
Cochran

[11] 3,867,649
[45] Feb. 18, 1975

[54] DRIVER

[75] Inventor: David S. Cochran, Palo Alto, Calif.

[73] Assignee: Hewlett-Packard Company, Palo Alto, Calif.

[22] Filed: Sept. 26, 1973

[21] Appl. No.: 400,750

[52] U.S. Cl. .................. 307/268, 307/255, 307/262, 307/264, 307/270

[51] Int. Cl. .................. H03k 5/12

[58] Field of Search ........... 307/255, 262, 268, 270, 307/264

[56] References Cited

UNITED STATES PATENTS

| | | | |
|---|---|---|---|
| 3,192,403 | 6/1965 | Bernfeld et al. | 307/255 X |
| 3,359,433 | 12/1967 | Thavland | 307/255 X |
| 3,519,851 | 7/1970 | Groner | 307/268 X |
| 3,789,241 | 1/1974 | Hess, Jr. | 307/255 |

*Primary Examiner*—John Zazworsky
*Attorney, Agent, or Firm*—Theodore S. Park; Roland I. Griffin

[57] ABSTRACT

Two identical drivers are utilized for driving an MOS device. Each driver utilizes a differentially configured transistor circuit to allow only one of two output level amplifiers to conduct. A first one of these output level amplifiers utilizes a transistor latching circuit. The second output level amplifier is a Darlington configured transistor pair, which utilizes unidirectional capacitive feedback from the output of the driver to the base of the input transistor of the second output level amplifier for controlling the fall time of the output of the driver. Diode junctions and resistive elements, which may be formed within the same integrated monolithic chip as the transistors, are utilized to limit undesirable spiking induced in the output of one of the drivers when the other driver is in a transition state.

7 Claims, 4 Drawing Figures

DRIVER

BACKGROUND AND SUMMARY OF THE INVENTION

Prior art clock drivers have typically utilized external diodes in order to clamp their outputs to desired values and thereby reduce capacitive coupling spike effects. If clamping is desired to be within less than a normal, forward-biased, silicon-diode voltage drop of a reference potential, typical practice has been to utilize germanium diode junctions or Schottky effect devices. Such a practice is relatively costly.

When two prior art clock drivers are utilized for driving MOS devices, the observed coupling capacitance in the MOS circuit between the clock drivers is usually considerable (for example, 15–75 pf). This capacitance increases the output rise time of the drivers and, when one of the two outputs of the drivers is switched, causes unwanted signal spikes of either positive or negative amplitude to appear at the output of the other driver. Such spiking can upset the operation of MOS devices.

The objectives of the present invention are to provide an improved driver for supplying a two level output voltage to a capacitive load, for clamping output levels to within less than a normal, forward-biased, silicon-diode voltage drop of a reference potential by utilizing inexpensive silicon-diode junctions, for providing rapid rise time and fall time characteristics in the presence of capacitive loading, and for controlling the rise and fall time output characteristics.

These objectives are accomplished in a driver according to the preferred embodiment of this invention by utilizing a silicon PNP-NPN transistor latching circuit in a first output level amplifier to provide rapid rise time output characteristics in the presence of capacitive output loading. An NPN-NPN Darlington configured transistor current amplifier is used in a second output level amplifier with unidirectional capacitive feedback to hold the fall time of the output of the driver to within specified limits when in transit between a first level and a second level. This avoids undesirable charge transfer on driven MOS devices. Unidirectional conducting devices are employed to establish different capacitive feedback paths depending on whether the output of the driver changes from the first to the second level or vice versa. Silicon Diode junctions and resistive elements, which may be developed upon the same silicon chip as the transistors of the driver, are utilized to limit the undesirable spiking induced in the output of a companion driver due to capacitive loading. This results in both a cost savings and a reduction in spiking levels. The driver provides a large swing output pulse with fast rise time notwithstanding the presence of a ten-to-one variation of capacitive loading. The rise and fall times of the output are controlled by the feedback capacitance and proper selection of resistive elements. Overshoot limiting is provided and rise and fall times are selecteed such that driver is suitable for driving MOS circuits.

DESCRIPTION OF THE PREFERRED EMBODIMENT

Figure 1:
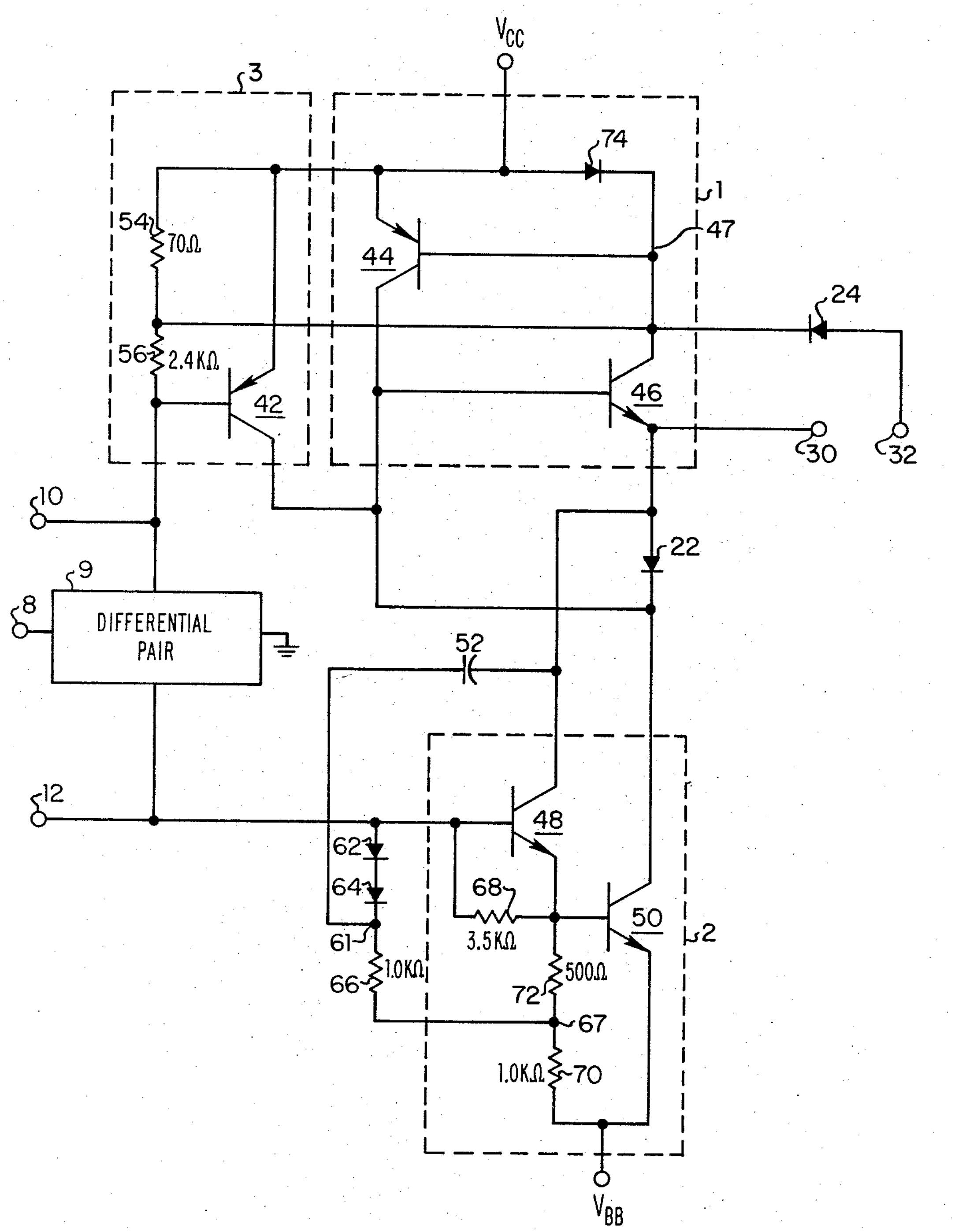
FIG. 1 is a detailed schematic representation of a driver in accordance with one of the preferred embodiments of this invention.

Referring to FIG. 1, a first output level amplifier 1 is driven by a positive feedback driver 3. A second output level amplifier 2 and the positive feedback driver 3 are each driven, for example, by a differentially configured pair 9 which allows only one of the two output level amplifiers to fully conduct at any instant in time. When an input 8 to the differentially configured pair 9 causes positive current to flow out of inputs 10 and 12, positive current will be drawn out of the bases of transistor 42 within the positive feedback driver 3 and transistor 48 within the second level output amplifier 2. This causes transistor 48 to cut off and transistor 42 to begin conducting.

Transistor 42 increases its emitter-to-collector conduction as positive current flow out of input 10 increases. This increased conduction by transistor 42 increases the base drive of transistor 46 within the first output level amplifier 1. Essentially all of the collector current flow of transistor 42 goes into the base of transistor 46, thereby increasing current flow into the collector of transistor 46. The increasing collector current flow of transistor 46 results in increased current flow through resistive element 54 of the positive feedback driver 3. This tends to forward bias the base-emitter junction of transistor 44 within the first output level amplifier 1. The voltage produced across resistive element 54, which is in shunt with the base-emitter junction of transistor 44, is of a polarity to forward bias this base-emitter junction. The increasing current flow through resistive element 54 also results in a positive feedback action on transistor 42 since the increasing voltage across resistive element 54 also increases the base-emitter voltage of transistor 42 thereby further increasing its conduction. Thus, the base drive of transistor 42 almost doubles even before transistor 44 turns on.

When the increasing voltage developing across resistive element 54 increases to a value sufficient to forward bias the base-emitter junction of transistor 44, the PNP-NPN pair of transistors 44 and 46 go into full latch. Full latch is defined to occur when base current is pulled out of transistor 44 by the collector current draw of transistor 46 and when the collector current flow of transistor 44 increases the base drive of transistor 46. When the current level reaches a point such that the current gain is approximately unity for the pair of transistors 44 and 46, the node 47 rapidly rises in potential. When the voltage difference between the supply voltage Vcc and the voltage at node 47 becomes insufficient to forward bias the base-emitter junction of transistor 44, the latch action ceases and transistor 44 cuts off. Transistors 46 and 42, however, continue to conduct.

Figure 2:
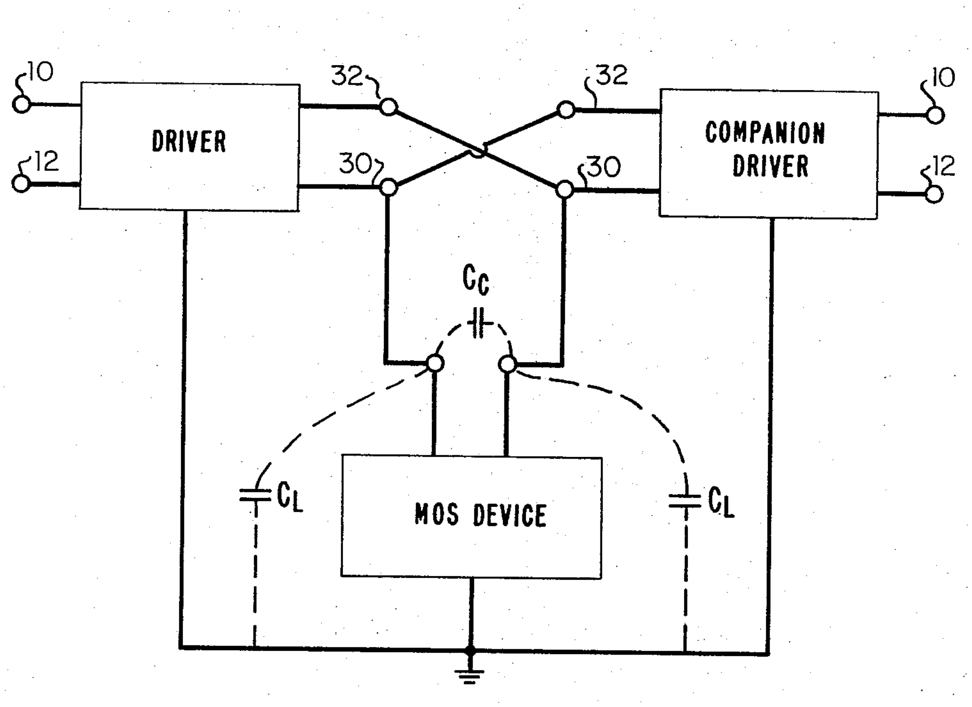
FIG. 2 is a block diagram showing how two of the drivers of FIG. 1 may be employed to drive a two port device such as an MOS device, with coupling capacitance Cc and loading capacitance $C_L$.
Figure 3:
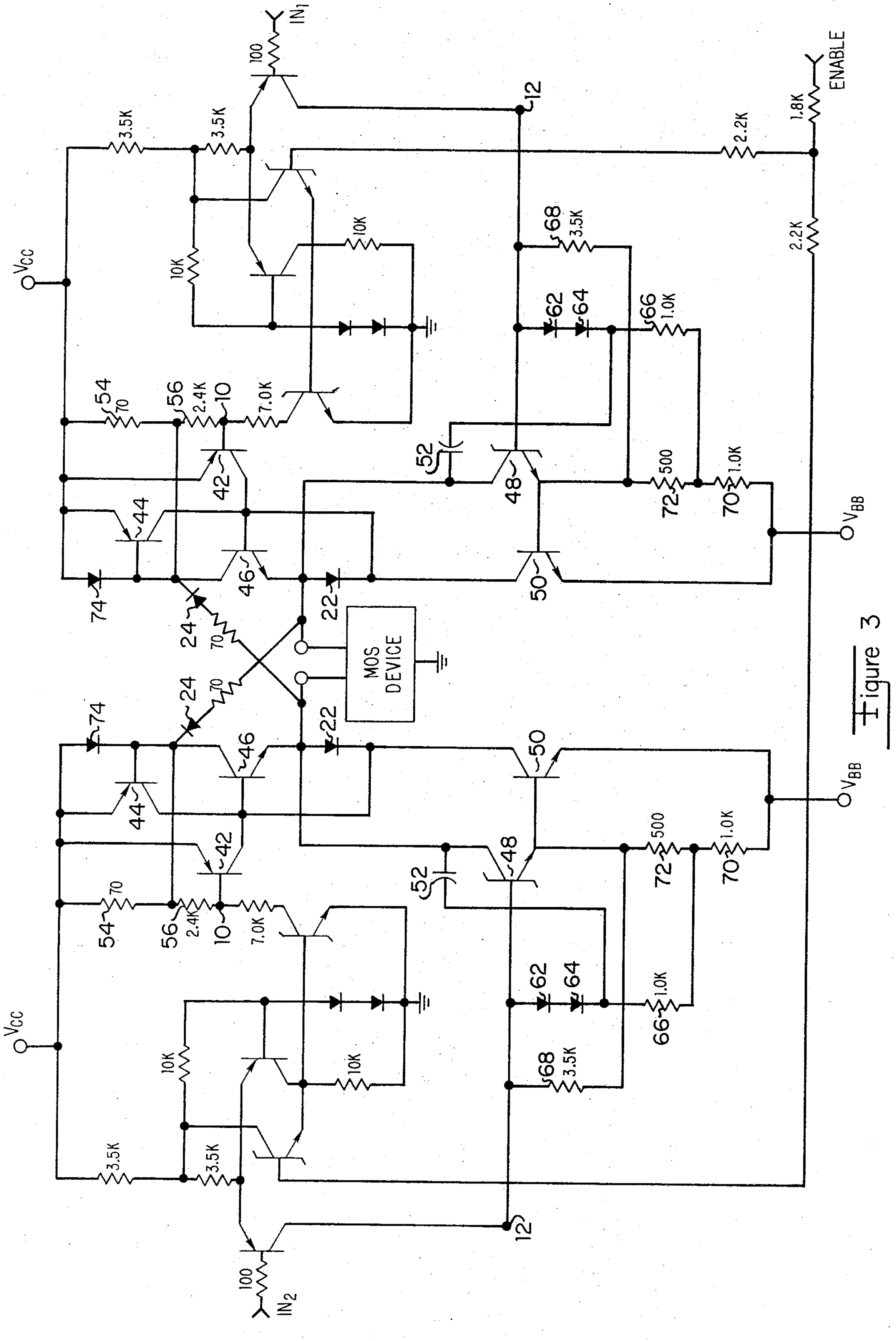
FIG. 3 is a schematic diagram of a preferred embodiment employing two drivers of FIG. 1 configured in the manner shown in FIG. 2.

When transistor 44 is conducting, diode 74 provides a forward-biased silicon-diode voltage drop below the supply voltage Vcc. This is used as a clamping potential for diode 24 to prevent cross-coupled spikes from occurring at terminal 32 as a result of cross-coupled capacitance and a rapid rise in voltage potential at output 30. When the voltage at output 30 rises due to the latch action of transistors 44 and 46, the voltage at node 47 is pulled down. This results in diode 24 being forward biased during this transition if the voltage at terminal 32 is greater than the supply voltage $V_{cc}$. Diode 24 therefore effectively clamps the output of a companion driver or capacitive load connected to terminal 32, as shown in FIGS. 2 and 3, to approximately the value of the supply voltage $V_{cc}$. The potential at terminal 32 will be the supply voltage $V_{cc}$ minus the forward bias potential developed across diode 24 plus the forward bias potential developed across diode 74. The spiking which would otherwise develop at the output of the companion driver or capacitive load connected to terminal 32 is thereby substantially eliminated and the output of a companion driver is therefore prevented from exceeding the supply voltage $V_{cc}$ during transient. Diodes 24 and 74 are internal silicon diodes which may be formed upon the same silicon chip as transistors 42, 44, and 46.

It should be noted that diode 74 could be eliminated and its function similarly performed by the base-emitter junction of transistor 44. However, diode 74 provides additional current handling capacity during transition, thereby precluding damage to transistor 44.

A feedback capacitance 52 provides protection against rapid charge transfer on MOS devices connected to drivers as shown in FIGS. 2 and 3 due to the output voltage at terminal 30 rising too rapidly. Referring to FIG. 1, base drive is diverted from transistor 46 by transistor 50 when transistor 50 is driven by current flow through the feedback capacitance 52. The current flow i through feedback capacitance 52 can be expressed by $i \approx C_{52}\, dV_{30}/dt$, where $C_{52}$ is the value of the feedback capacitance and $dV_{30}/dt$ is the time rate of change of the voltage at output terminal 30. A portion of the current flow from the emitter of transistor 46 passes through feedback capacitance 52, and resistive elements 66 and 72 into the base of transistor 50. Resistive elements 66 and 70 form a current and voltage dividing network which determines the threshold level for control of this drive. Assume a condition wherein there will be a rapidly rising output voltage at terminal 30 as, for example, when the first output level amplifier has just come on and the second output level amplifier is off. In this situation transistor 48 is off and there is no current flow from the emitter of transistor 48. Transistor 50 is also off and reference to the location of resistors 70 and 72 in FIG. 1 will reveal that the base-emitter bias of transistor 50 is determined by current flow through resistors 70 and 72. Since there is no current flow through resistor 72 the bias of transistor 50 is determined by the current flow through resistor 70. In this example, if resistive element 70 is 1,000 Ω there must be a .7 ma current developed through resistive element 70 before transistor 50 can conduct. Since this current is a function of the rate of change of the output voltage at terminal 30 ($i \approx C_{52}\, dV_{30}/dt$) a rise time threshold can be determined by proper selection of resistive elements 66, 70, 72 or varying the feedback capacitance 52. When the drive to transistor 50 increases to a level sufficient for transistor 50 to begin conducting from its collector to emitter, a portion of the base drive current to transistor 46 will be diverted to the collector current of transistor 50 thereby increasing the rise time.

Figure 4:
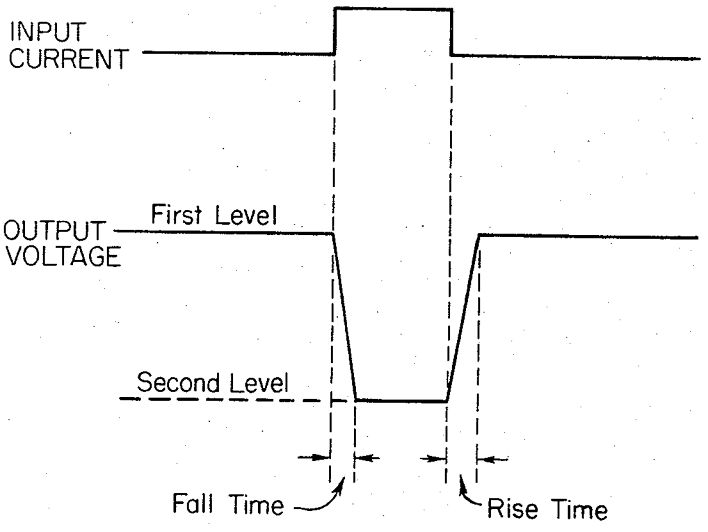
FIG. 4 is a representation of the relationship between input current and output voltage of the driver of FIG. 1.

The second output level amplifier begins operation when the output of the driver is at the first level shown in FIG. 4 and positive current flow is injected into inputs 10 and 12. Transistor 42 is cut off as a result of the positive current input thereby eliminating its collector current flow into the base of transistor 46. This causes transistor 46 to come out of conduction and approach cut off.

The base-emitter forward bias and emitter current flow of transistor 48 increases as a result of increased positive current flow into input 12. The increased emitter current flow of transistor 48 develops an increasing voltage across resistive elements 70 and 72. The voltage developed by current flow through resistive elements 70 and 72 establishes the baseemitter bias of transistor 50. When the voltage developed reaches approximately .7 volt the base-emitter junction of transistor 50 becomes forward biased and transistor 50 conducts. When it conducts, this further disables the first output level amplifier 1 by increasing the forward bias on diode 22 which forces reverse bias voltage across transistor 46 thereby further precluding latch action. The second output level amplifier derives current necessary to forward bias diode 22 from the capacitance associated with a driven load connected to terminal 30. Since the output 30 of the driver was at the first level shown in FIG. 4 when the second output level amplifier began operation, the stored charge associated with a capacitive load is sufficient to create the current necessary to forward bias diode 22. The limited current handling capacity of transistor 42 limits the current flow in the path from the collector of transistor 42 to the collector of transistor 50.

When the output of the driver falls in value, a current $i$ approximately equal to $C_{52}\, dV_{30}/dt$ is developed in the feedback capacitance 52. A portion of this current flow is utilized to divert current from the base of transistor 48. In order to slow down the fall time when the output is changing from the first level to the second level, diodes 62 and 64 are utilized with resistive voltage dividing network 70 and 72 to provide controlled unidirectional feedback. For the diodes to conduct, node 61 must go negative with respect to the base of transistor 48 and the anodes of diodes 62 and 64.

The resistive voltage dividing network 70 and 72 provides a threshold voltage at node 67. The voltage produced across resistive element 66 must reach approximately .5 volt before diodes 62 and 64 begin conducting. When the voltage between node 61 and the base of transistor 48 is greater than two forward-biased silicon-diode voltage drops (or approximately 1.4 volts) the diodes 62 and 64 fully conduct thereby diverting the base drive current of transistor 48 through the feedback capacitance 52. Assuming circuit values of feedback capacitance 52 equal to 2 pf and a voltage at output 30 equal to 15 volts, the time rate of change of the voltage at output 30 required to produce a .5 ma current in resistive element 66 is $60 \times 10^{-9}$ sec. Any fall time faster than $60 \times 10^{-9}$ sec produces a greater time rate of change of the voltage at output 30 and a resulting greater current flow through resistive element 66. The greater current flow through resistive element 66 produces a voltage across resistive element 66 greater than .5 volt causing diodes 62 and 64 to become forward biased. This results in base current being diverted from transistor 48. A fall time longer than $60 \times 10^{-9}$ sec. produces an insufficient current through the feedback capacitance 52 to forward bias diodes 62 and 64 thereby precluding a diversion of base current from transistor 48 for slower fall rates at output 30.

A driver made in accordance with the preferred embodiment will have input current and output voltage characteristics as depicted in FIG. 4. A two level output voltage is provided as shown and has adjustable rapid rise and fall time characteristics. Spiking which is present when MOS devices are driven by typical drivers is reduced by the described embodiment to an insignificant level and spiking is therefore not shown in FIG. 4.

Two drivers made in accordance with the invention may be utilized as shown in FIG. 2 for driving a two port device such as, for example, an MOS device or the like. Referring to FIG. 2, an MOS device having two input ports has each input port connected to an output terminal 30 of a driver made in accordance with the invention. Terminal 32 of each driver is connected to terminal 30 of the other driver in order to reduce spiking effects. Capacitive coupled spike effects occurring at the output of either driver when the other driver changes output levels are effectively suppressed in this configuration to be within less than a normal, forward biased, silicon-diode voltage drop.

Referring to FIG. 3, there is shown a more detailed representation of the preferred embodiment of the invention illustrating two drivers made in accordance with the invention and configured as in FIG. 2. A detailed embodiment of the differential pair 9 shown in FIG. 1 is also illustrated in FIG. 3. The embodiment illustrated in FIG. 3 meets the stated objectives of providing a two level output voltage in the presence of capacitive loading, clamping output levels to within less than a normal, forward biased, silicon-diode voltage drop of a reference potential, providing rapid rise time and fall time characteristics in the presence of capacitive loading, and controlling the rise and fall time output characteristics.

I claim:

1. A driver comprising:

a first output level amplifier having an input and an output;

a second output level amplifier having an input and an output connected to the input of the first ouput level amplifier;

a first unidirectional conducting device having an anode connected to the output of the first output level amplifier and having a cathode connected to the output of the second output level amplifier;

a threshold detector;

a second unidirectional conducting device having an anode connected to the input of the second output level amplifier and having a cathode connected to the threshold detector; and a feedback capacitance coupled in series with the threshold detector and between the threshold detector and the output of the first output level amplifier.

2. A driver as in claim 1 including means coupled to the first output level amplifier for providing positive feedback.

3. A driver as in claim 1 wherein the feedback capacitance is variable.

4. A driver as in claim 1 wherein the first output level amplifier includes a transistor latch circuit having a first PNP transistor and a second NPN transistor each with an emitter, a base, and a collector;

means for connecting the base of the first transistor to the collector of the second transistor, and the collector of the first transistor to the base of the second transistor;

means coupled to the input of the first output level amplifier for driving the base of the second transistor; and means for connecting the emitter of the second transistor to the output of the first output level amplifier.

5. A driver as in claim 1 wherein the second output level amplifier includes a Darlington configured transistor pair having a first NPN transistor and a second NPN transistor each with a base, an emitter, and a collector; and means for connecting the base of the first transistor to the input of the second output level amplifier, the emitter of the first transistor to the base of the second transistor, the collector of the first transistor to the output of the first output level amplifier, and the collector of the second transistor to the cathode of the first unidirectional conducting device.

6. A driver as in claim 4 wherein the first output level amplifier includes a third unidirectional conducting device having an anode and having a cathode connected to the base of the first transistor and to the collector of the second transistor;

means for connecting the output of the first output level amplifier to one of a plurality of input ports of a load to drive said one input port; and means for connecting the anode to another of the plurality of input ports of said load.

7. A driver as in claim 4 comprising a fourth unidirectional conducting device having an anode connected to the emitter of the first transistor and a cathode connected to the collector of the second transistor.

* * * * *